United States Patent [19]

Comer

[11] Patent Number: 5,838,060
[45] Date of Patent: Nov. 17, 1998

US005838060A

[54] STACKED ASSEMBLIES OF SEMICONDUCTOR PACKAGES CONTAINING PROGRAMMABLE INTERCONNECT

[76] Inventor: Alan E. Comer, 6505 153rd Ave. E., Sumner, Wash. 98390

[21] Appl. No.: 571,290

[22] Filed: Dec. 12, 1995

[51] Int. Cl.$^6$ .................................................. H01L 23/02
[52] U.S. Cl. .......................... 257/685; 257/686; 257/723; 257/712; 257/665
[58] Field of Search ........................ 257/686, 665, 257/723, 685, 668, 690, 712, 700

[56] References Cited

U.S. PATENT DOCUMENTS

| | | | |
|---|---|---|---|
| 4,991,000 | 2/1991 | Bone et al ................................. | 357/75 |
| 4,993,954 | 2/1991 | Prevost ..................................... | 257/665 |
| 4,996,587 | 2/1991 | Hinrichsmeyer et al. ................. | 357/74 |
| 5,019,945 | 5/1991 | Smolley .................................... | 361/412 |
| 5,043,794 | 8/1991 | Tai et al. .................................. | 257/686 |
| 5,130,894 | 7/1992 | Miller ....................................... | 361/393 |
| 5,172,303 | 12/1992 | Bernardoni et al. ..................... | 361/396 |
| 5,222,014 | 6/1993 | Lin et al. ................................. | 361/414 |
| 5,241,456 | 8/1993 | Marcinkiewicz et al. .............. | 361/792 |
| 5,347,428 | 9/1994 | Carson ..................................... | 361/760 |

Primary Examiner—Tom Thomas
Assistant Examiner—Roy Potter
Attorney, Agent, or Firm—David L. Tingey

[57] ABSTRACT

A stackable semiconductor package is described which has external contact points (pins, pads, solder-bumps, etc.), which are arranged in arrays on the top and bottom surfaces of the package. This package also has internal contact points (bond pads) for connection to an integrated circuit die. The external and internal connection points are connected by a programmable interconnection matrix, which may be manufactured separately from the package body and then assembled within the package. The internal contact points can each be selectively connected to the external contact points, and selective connections can also be made linking pairs of the external contact points. Stacks of such packages, containing different dice, may be formed, creating large, tightly-coupled circuit blocks. A presently-preferred embodiment of the programmable package is described in which the package body and programmable matrix are manufactured as a unit. The described embodiment comprises a package body (12) with a formed recess (14) for receiving a package lid (50) surrounding a deeper die cavity (16), both on the package's top surface. After mounting, an integrated circuit die (20) is connected through internal contact points (24) to a first metal trace layer (28) formed on the package's bottom surface. A second metal trace layer (30) is connected to the package external contact points, consisting of a horseshoe-shaped array of solder bumps (38) on the package bottom, a matching array of solder-contacts (42) on the top, a linear array of solder bumps (34) along one edge of the package, and a matching linear array of solder-contacts (36) along the opposite edge of the package. A flange on lid (50) is bonded to lid recess (14), and the lid body is bonded to the surface of IC die (20) with a material which is thermally conductive, but electrically insulating. The lid conducts heat away from the IC die, and extends beyond the package body to act as a cooling fin for the package. If further cooling is required, a hole (52) bored through the lid beyond the package body may be used to bolt the lid to a heat sink. Alternatively, a heat sink or heat dissipation device might be connected to the lid using a conductive epoxy.

8 Claims, 4 Drawing Sheets

STACKED ASSEMBLIES OF SEMICONDUCTOR PACKAGES CONTAINING PROGRAMMABLE INTERCONNECT

BACKGROUND

1. Field of Invention

The present invention relates to semiconductor devices, and more specifically to configurable packages suitable for use in a three-dimensional stacked array including provisions for interconnection of all integrated circuit dice included in the stack.

2. Description of Prior Art

It has long been realized that electrical circuits can achieve higher densities, greater modularity, and higher speeds when they are stacked together in a three-dimensional array, rather than spread out over a comparatively-large area in a two-dimensional pattern. Different stacked arrangements of circuits have been utilized for many years; in fact, even before the advent of the integrated circuit (IC) chip, stacked modules, each containing several electrical components, were sometimes used as "building blocks" in systems designs. The most common use today of this circuit-stacking technique is the popular and powerful "backplane" concept (where parallel printed circuit boards (PC-boards) are plugged into receptacles or "slots" in a central motherboard). Almost all computers today take advantage of this useful arrangement.

Such "stacked PC-board" arrangements are commonly used today in personal computers, and vividly demonstrate the compactness and modularity of the stacking concept. A standard personal computer with 8 filled slots has far more total PC-board area even than the footprint of the computer, and the add-on cards can be selected from thousands of available boards.

However, the expected speed advantage of a stacked arrangement is not apparent when evaluating circuits stacked at the PC-board level. This is because stacked PC-board arrangements still spread the overall circuit out over a large physical space: the above personal computer example uses stacked PC-boards populated with standard IC packages, each board being about 10 cm×30 cm, separated by approximately 2 cm. In fact, in a standard personal computer today advertised to run at a specified clock speed, only a small section of the (two-dimensional) motherboard, including the central processing unit (CPU) and selected peripheral chips, actually runs at the specified speed. Typically, the bus which connects the stacked PC-boards to the CPU actually runs much slower than the specified clock speed; the bus speed is often at least ten times slower than the clock speed. Clearly, this stacked arrangement at the PC-board level is used for its compactness and modularity, and has no significant speed advantage.

Despite the lack of significant speed advantages, this stacked circuit arrangement at the PC-board level is by far the most prevalent application of the stacking concept today. This has come about for a variety of reasons, primarily having to do with cost and time-to-market. In order to understand why stacked PC-board applications are so overwhelmingly popular compared to other stacking methods, it is necessary to look at the methodology used when building an electronic system.

ICs as they are produced today are inherently two-dimensional. They are produced by building up successive layers, each patterned using plate microlithography, on a two-dimensional wafer substrate. Each wafer is subsequently diced into individual chips, each of which performs a required electrical function. IC chips are generally sold pre-tested in packaged form. The packages used are generally made in technologies which bridge the microscopic world of the integrated circuit, where critical dimensions are currently measured in tenths of micrometers, to the macroscopic world of the PC-board, where critical dimensions are now measured in tenths of millimeters. Almost all chip packages are designed to be mounted directly onto a PC-board, so the package external contacts (pins, solder-bumps, etc.) are spaced at intervals compatible with PC-board dimensions. Because the external contacts are spread out compared to chip dimensions, most IC packages are much larger than their enclosed chip, yet smaller than a typical PC-board. To make a system, designers connect different ICs together using PC-boards whose pads and conductors mate with each IC.

When designing a new electronic system, systems designers can thus manufacture custom circuits at several levels; they can use custom IC chips, custom packages, or custom PC-boards.

Custom ICs, also known as application-specific ICs (ASICs) are an increasing, but still relatively small, sector of the total IC market. The high tooling costs and long lead times needed to produce an ASIC are prohibitive for most applications. In general, systems designers use standard, relatively economical ICs as much as possible in their designs.

Designing and building custom packages is also expensive, and the lead time from the beginning of the package design cycle is quite long. Because of this, chip packages are generally considered as being relatively fixed, especially in terms of the package external form factor. Again, systems designers rely on standard packages as much as possible in their designs.

In contrast, systems require a custom PC-board design which defines the connectivity of the individual components and packaged chips. The cost required for the custom PC-board is unavoidable, since the PC-board defines the entire circuit. And the tooling costs and lead times for custom PC-boards are both affordable, especially when compared with the costs of producing custom packages or ASICs for each chip in a design.

Thus, as much as possible, systems designers today use standard IC chips in standard packages, mounted on custom PC-boards, in order to build their products.

With this overall methodology in mind, it is easy to see why circuit-stacking is primarily used at the PC-board level. In any proposed stacking technology, a "pancake stack" of circuits requires that each "pancake" must have its own custom interconnections, which mate with the connections on the pancakes above and below it in the stack. These custom interconnections define the wiring connectivity of the components, and thus define the system. As discussed above, custom chips and custom packages are expensive and time-consuming to produce using standard techniques, while custom PC-boards are relatively cheaply and quickly fabricated; also, systems require custom PC-boards anyway. Thus, using prior-art technologies, relative cost and time-to-market dictate that circuit stacking be commonly used only at the PC-board level, despite the low speed inherent in this approach.

In the past, such speed considerations were not of paramount importance; systems were able to run at speeds consistent with the speed of available integrated circuits even when using an essentially two-dimensional system-level arrangement. Today, however, integrated circuits are fast enough that the interconnections between chips are beginning to dominate system performance. Different circuit stacking arrangements which are inherently faster and denser than PC-board stacking have begun to be investigated.

The comparative speed advantages between different stacking schemes can be qualitatively compared by comparing the longest distance a signal might have to travel. This distance defines the time-of-flight for a worst-case electrical signal, and is also proportional to the worst-case parasitic resistance, inductance and capacitance values in a given technology. These parasitic values in turn help determine the power consumption of the system. In the personal-computer example mentioned above, using stacked PC-boards with edge connectors at one end of one side, the worst-case signal would have to travel from the first board's far end to its connector, then along the motherboard to the farthest board's connector, and then out to the far end of that board. This would total perhaps 2 cm from an IC die through its package, about 30 cm along one end board, another 7*2 cm to access the board on the other end, 30 cm out to the farthest package on that board, and another 2 cm through the receiving package, for a total of about 78 cm. This large "characteristic distance" is comparable to the largest dimension of an equivalent, but fully two-dimensional arrangement; this explains why no especial speed advantage is obtained. Other stacking schemes with shorter characteristic distances would typically have correspondingly greater speed advantages; thus, circuit stacking at several levels, each more compact than PC-board stacking, is being studied.

Of course, the most basic level to begin stacking circuits would be to "layer" multiple integrated circuits together on the same substrate, building up circuit upon circuit with built-in interconnections between layers through vias. The characteristic distance in this case would be equal to an IC maximum dimension (perhaps 1 cm) plus several thicknesses (tens of micrometers at most), or roughly 78 times shorter than the critical dimension of the personal-computer example. With such a comparative advantage, such an approach has been investigated and is still under investigation; this approach is inherently the most compact and may well be the fastest arrangement, but is plagued by practical difficulties. For example, it is difficult to keep such a compact structure cool during operation. Also, processing problems such as perfecting planarization techniques between layers, developing re-crystallization techniques for creating quality semiconductor material for upper layers, and basic yield considerations make this approach to stacking circuits extremely expensive; in fact, many of the problems inherent in true 3-d circuits have no solution using current technology. With the current state of the art, such truly three-dimensional integrated circuits are not feasible.

The next logical level at which circuits might be stacked is at the die level; separately-manufactured integrated circuit dice can be stacked atop one another with some type of interconnection scheme linking their signals together. This approach would have a critical dimension as small as one IC maximum dimension (1 cm) plus several wafer thicknesses (perhaps 7*0.625 mm), or roughly 54 times shorter than the personal-computer example. And in fact, an increasing interest in such an approach is becoming apparent. For example, U.S. Pats. No. 4,394,712 (1983) and 4,499,655 (1985) to Anthony describe a rather exotic technique for stacking silicon-on-sapphire (SOS) substrates using bored and plated holes as vias to interconnect the various circuits. Of course, each substrate must be designed for use in the stack. And such an approach is even more expensive than standard SOS chips, which are already prohibitively expensive for consumer applications. Another interesting approach is described in U.S. Pat. No. 5,019,943 (1991) to Fassbender et. al.; a stack of chips is presented wherein one edge of the chip stack assumes a "zig-zag" shape which exposes bond pads along the edge of each chip. Electrical connections between chips are made using bond wires to connect bond pads above each other along an edge of the stack. As another example, U.S. Pat. No. 5,347,428 to Carson et. al. describes a similar stack of chips, specifically memory chips, integrated with a microprocessor. Although Fassbender does not specifically mention memory chips as his primary application, his approach is also best suited for stacks of memory chips, since interconnections between chips are specifically available along only one edge of the stack; this limits the numbers of inputs/outputs (I/Os) and is most suited to chips which are relatively large but have relatively few I/Os themselves (such as memory chips). In fact, because of the limited interconnections in all of these approaches, most prior-art chip-stacking schemes are not applicable to stacks of general-purpose chips which may include chips with many I/Os. Also, chip-stacking approaches are generally most applicable to memory chips, because the dice should ideally be the same size, and thus must usually be the same chip; in most systems, only memory chips are used in large-enough quantities to make such a stack practical. And even if all chips produced today were exactly the same size, there would still be problems interconnecting chips in a stack; witness the difficulty in connecting a pad on one corner of a chip to a pad on the opposite corner of the next-higher chip in the stack. In general, prior-art chip-stacking schemes require chips to be nearly the same size, and allow only a limited number of connections between chips, each of which must be nearly parallel to the stack axis. This requires each chip to be designed specifically for use in the stack (which is prohibitively expensive), or else each chip must be substantially similar to the others in the stack. In summary, chip-stacks of non-identical chips are not a practical approach to general-purpose circuit stacking because they are too expensive, provide too little I/O capability, and require each chip to be specifically designed for use in a particular stack.

The next level at which circuits might be logically stacked together would be at the package level. The addition of a package surrounding each die adds another standard size (the package size) which is relatively independent of die size. And more I/O capability may be built into each stackable package than is provided by prior-art chip stacks. Furthermore, the interconnecting conductive traces in a package can also be designed to have less resistance and less parasitic capacitance than an integrated-circuit trace, yet be much shorter than a PC-board trace, since the density is intermediate between integrated circuit dimensions and PC-board dimensions. Although a stacked-package arrangement would not be as compact as true three-dimensional circuits or stacked chips, the size of a package stack would still be small enough to expect significant speed advantages. For example, packages as thin as 1 mm are already being produced, and perimeter ball-grid-array packages perhaps 1.5 times the linear dimensions of an IC die are now available. And with packages interconnected together within the stack, most of the packages do not need to interface with a PC-board at all; stackable packages can thus be built using new, even-smaller packaging technologies. Even using these dimensions, the characteristic distance of a package stack would be 1.5 cm plus 7*1 mm, or roughly 35 times shorter than the personal-computer example above.

However, package stacks are not now in common use. This is primarily due to the practical concerns mentioned above with prior-art packaging technologies. Although each die need not be designed for use in the stack, each package must be designed specifically for use in the stack, with the correct connections among package internal and external contact points designed in. As mentioned previously, the costs and delays associated with designing even one such custom package are not small; the total cost and delay associated with designing and manufacturing a matched set of stacking packages is prohibitive. For example, to make a general-purpose stack comprising ten disparate dice, ten different mating packages need to be designed, and prototypes built and debugged, before the overall circuit can even be tested. Using prior-art technologies, such a stacked-package arrangement has historically been feasible only for large, vertically-integrated companies that design and manufacture chips, packages, and entire systems.

Despite these limitations, the advantages of a stacked-package arrangement are too attractive to ignore; such package-level stacking schemes are increasingly being investigated.

Of course, most prior-art package-stacking schemes use fairly-standard packaging technologies. For example, U.S. Pat. No. 5,043,794 (1991) to Tai et. al. describes multi-layer sintered ceramic packages, which can be stacked not only one atop another, but also side-to-side. In fact, the described structures include stacks of stacks wherein each stack is rotated 90degrees with respect to its neighbors. Also, U.S. Pat. No. 5,172,303 (1992) to Bernardoni et. al. describes a stackable surface-mount chip-carrier package wherein the packages are connected together using solder balls which align with recesses in the next package. However, these patents provide no low-cost, practical method for producing custom versions of each package in the stack. Also, since these approaches use standard packaging technologies, the package sizes are similar to those of standard, two-dimensional packages which are compatible with coarse PC-board conductor spacings. Thus, these stacks of standard-technology packages are too large, prohibitively expensive, and require a long lead time to produce.

Other approaches use newer packaging techniques based on PC-board technology. For example, U.S. Pat. No. 5,247,423 (1993) issued to Lin discloses a package based on a PC-board substrate, with external contacts formed in notches on opposing edges of the substrate; the packages are stacked with these notches mated with solder-coated wires, and a heat cycle reflows the solder to complete the connections. A somewhat similar approach is described in U.S. Pat. No. 5,241,454 (1993) to Ameen et. al. wherein each package is based on a flexible PC-board with holes, punched in predetermined positions, which align with long pins protruding from a rigid substrate; a heat cycle is used to solder pads formed on each layer to selected ones of these pins. The approaches described in these patents use PC-board substrates in order to take advantage of the low tooling costs and quick turnaround of PC-board substrates; custom versions of each package can be produced at a reasonable cost, and in a reasonable time. However, since the technology is based on PC-board technology, these packages again will be of a size compatible with coarse PC-board spacings. In fact, because of the relatively-large via spacings of PC-board technology, packages of this type with many I/Os will be even larger than packages made in standard technologies.

Also, the approaches described in these two patents have vertical connections (wires or pins) which are unbroken from the bottom of the stack up to the top of the stack. Such an arrangement is inefficient; a taller stack will always require more pins, even if each level requires a fixed number of I/Os. Clearly, these stacks of packages based on PC-board technology are still too large, and their inefficient I/O arrangements are only suitable for short stacks or packages with few I/Os.

Still other approaches use circuit stacking at a level intermediate between chip stacking and the PC-board stacking level; stacked multi-chip modules (MCMs) are also being increasingly studied in recent years. In this approach, each level in the stack includes more than one chip, but is still small enough to produce a speed benefit. For example, U.S. Pat. No. 5,222,014 (1993) to Lin describes a stackable MCM where each level can contain more than one die, and levels are connected together using preformed solder bumps on the top and bottom surfaces. And U.S. Pat. No. 5,019,945 (1991) to Smolley describes a stack of MCMs wherein small PC-board modules containing multiple dice are manufactured with regular arrays of conductors on top and bottom surfaces; these modules are alternated in the stack with custom-designed interconnection layers consisting of an insulator with conductive pads, and removable "fuzz-button" conductors dispersed into selected ones of holes aligned with the module conductors. Of course, such approaches have the advantages of multi-chip expansion in all three dimensions, making particularly-large circuits possible in a compact space. However, heat dissipation is an even greater problem with MCM stacks than with package stacks. Also, with the steady shrinkage in integrated-circuit critical dimensions, a single IC chip is becoming an ever-increasing portion of the overall design. Thus, the ability to include more than one chip on each level in a stack is not necessarily a great advantage. Moreover, it is even more difficult to quickly and economically produce custom module-level packages. In addition, these approaches also have the problems unique to multi-chip-modules in general: the problems associated with a lack of known-good-dice, which leads to low module yield and resultant high costs; the difficulty of reworking a defective multi-chip module; and the difficulty of fully testing assembled modules. MCM stacks introduce further practical problems and even higher costs in order to provide increased density; such an approach is only justifiable for extremely-complex high-speed designs where cost is not a primary concern.

OBJECTS AND ADVANTAGES

Accordingly, several objects and advantages of the present invention are:

(a) To provide a means for forming 3-d circuit stacks which provide a significant speed advantage compared to a 2-d circuit arrangement.

(b) To provide a 3-d circuit-stacking technique that is both feasible and economical using current technology.

(c) To provide a means for interconnecting non-identical integrated circuit chips in a stacked arrangement which does not require each chip to be custom-designed for use in the stack.

(d) To provide a method of interconnecting non-identical integrated circuit chips in a stacked arrangement which does not require the chips to be similar in size and configuration.

(e) To provide a quick and economical means of producing customized stackable semiconductor packages.

(f) To provide a method of interconnecting non-identical integrated circuit chips in a stacked arrangement rich in connections and efficient in its use of input and output connections between chips in the stack.

(g) To provide a means of producing custom, high-speed, vertically-linked multi-chip-modules which can still be tested at the package level and thus bypass many of the traditional multi-chip module limitations.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purposes of the invention as embodied and broadly described herein, a stackable, configurable semiconductor package is provided, having a plurality of external electrical contact points disposed on the exterior surfaces of said package, a semiconductor chip within said package, and a programmable means for selectively connecting ones of the external electrical contact points to the chip and to other ones of the external contact points. Preferably, the exterior surfaces of said package include a first major surface (referred to herein as the top surface) and a second major surface (referred to as the bottom surface) which are substantially parallel to one another; the external electrical contact points preferably comprise at least a first array of first terminals or top terminals disposed on the top surface and a second array of second terminals or bottom terminals disposed on the bottom surface. The package preferably includes an interconnect means whereby each first terminal can be mated with and connected to any second terminal. Thus, any first package whose first array substantially matches the second array of any second package may be mounted with the top surface of the first package opposing the bottom surface of the second package; the matching arrays are connected, so that the packages are stackable.

According to the invention, the package is preferably designed to facilitate a stacked arrangement with the top surface of any selected package opposing the bottom surface of any next successive package. The programmable means for selectively connecting ones of the external contact points to one another or to the enclosed chip preferably comprises a programmable interconnection matrix linking the external contact points and the enclosed chip. A means for programming the matrix is included to ensure that each package is configurable after manufacturing.

Preferably, the programmable matrix is designed to permit connections including two primary types. A first connection type links the chip to one of the external contact points. Connections of this type can be further classified into two sub-categories: connections which link one of the top terminals of the package to the enclosed chip (referred to herein as root connections), and connections which link one of the bottom terminals of the package to the enclosed chip (referred to herein as branch connections). A second connection type links two or more of the external contact points, and is referred to herein as a trunk connection. When using the package stacks of the current invention to form circuits, one interconnects the enclosed chips using these connections and the interconnections between packages. For example, consider a connection between a first chip in a first package and a second chip in a second package, where the second package is mounted directly atop the first package. One uses a branch connection to connect one of the bottom terminals of the second package to the second chip; this bottom terminal is connected to a corresponding top terminal of the first package. A root connection, linking this corresponding top terminal to the first chip, completes the connection. One uses trunk connections when there are other package intervening between the two connected packages; a trunk connection linking a top terminal to a bottom terminal allows a signal to pass through a package from top to bottom. With proper selection of trunk connections, a signal can pass through all intervening packages in a stack, connecting a chip in the lowest package, through a root connection, a plurality of trunk connections in series, and a branch connection, to a chip in the topmost package.

Accordingly, there is also provided in accordance with the present invention, an assembly of electrically interconnectable semiconductor packages, comprising: a plurality of stackable, configurable semiconductor packages, each including a programmable means for making selected electrical connections from a die within the package to contact points disposed on the exterior package surfaces, and for connecting together selected contact points disposed on the exterior package surface. Each package includes: a package body with substantially parallel top and bottom exterior surfaces, having a cavity for placement of a die and a die mounted within said cavity, and having a plurality of internal electrical contact points and a means for connecting the die to at least one of the internal contact points. Each package further has a plurality of external contact points disposed on the top and bottom exterior surfaces of the package body. The external contact points comprise at least a first array of first terminals on the top surface and second array of second terminals on the bottom surface; each first terminal may be matably connected to any second terminal, so that the packages may be connected.

Packages of the present invention may be constructed by manufacturing the package body using standard packaging technology, and then mounting a separately-manufactured programmable matrix, manufactured on a separate substrate, at the time the die and package are assembled together. However, the presently-preferred embodiment of the invention integrates the package body and programmable substrate, for reduced size and cost.

Preferably, said package body is a multilayer package body having a plurality of alternating layers of at least one layer each of conductive traces and insulating material. A first layer of the alternating layers is a layer of first conductive traces wherein each first trace is operably connected to one of said internal contact points. A second layer of the alternating layers is a layer of second conductive traces within the package body, and a third layer of the alternating layers is a layer of insulating material separating the first layer from the second layer. A plurality of intersections is formed where the first conductive traces intersect with the second conductive traces. A plurality of trace-to-trace programmable interconnection elements link the first conductive traces to the second conductive traces, each located at or near the respective intersection between the first and the second conductive traces. A plurality of trace-to-contact programmable interconnection elements link the contact points disposed on the exterior package surface with the second traces. And a plurality of contact-to-contact programmable interconnection elements link selected pairs of external contacts together. Means are provided for selectively programming the interconnection elements.

In accordance with the present invention there is also provided a method for preparing a high-speed, high-density integrated circuit assembly including a plurality of previously-selected integrated circuit chips interconnected according to a predetermined plurality of desired chip connections, comprising: providing a plurality of individually-programmable, electrically interconnectable, stackable integrated circuit packages, wherein each package includes at least one of said plurality of previously selected integrated circuit chips; translating said predetermined plurality of desired connections between the integrated circuit chips into a plurality of programming instructions for said plurality of packages; individually programming each package of said plurality of packages; and aligning and stacking said plurality of packages in an array. Preferably, programming each package comprises forming selected electrical connections between a chip within the package and a plurality of external electrical contact points, and forming electrical connections between pairs of said external electrical contact points. Desirably, each programmed package may be tested before stacking the packages in array form.

BRIEF DESCRIPTION OF THE DRAWINGS

The accompanying drawings, which are incorporated in and constitute a part of the specification, illustrate a preferred embodiment of the invention and, together wit a general description given above and the detailed description of the preferred embodiment given below, serve to explain the principles of the invention.

REFERENCE NUMERALS IN DRAWINGS

10 Package body/IC die sub-assembly
12 Package body
14 Recess in package body to which the package lid flange is bonded
16 IC die cavity in package body
20 IC die
21 IC bond pad
22 Bond wires connecting IC bond pads 21 to package internal contact points 24
24 Package bond pad (internal contact point)
26 Via connecting package internal contact point to first metal trace layer
28 First metal layer
29 Programmable interconnection elements linking traces in first metal layer 28 to traces in second metal trace layer 30.
30 Second metal layer
31 Programmable interconnection elements linking traces in second metal layer 30 to top package solder-contacts 38 (through vias 32).
32 Via connecting package solder-contact 38 (top surface external contact point) to traces in second metal trace layer 30
33 Programmable interconnection elements linking traces in second metal layer 30 to bottom package solder-contacts 42 (through vias 40).
34 Solder bump (package external contact) on one side of package body
36 Solder-pad (package external contact) on side of package body opposite solder bump 34
37 Programmable interconnection elements linking traces on first conductor layer 28 to side package solder contacts 34 and 36
38 Solder-pad (external contact point) on top face of package body
40 Via connecting package solder bump 42 ( bottom surface external contact point) to traces in second metal layer 30
42 Solder bump (external contact point) on package bottom face
48 Thermally-conductive, electrically insulating bonding material such as epoxy which bonds the IC die to the package lid, forming a thermal contact, but no electrical contact.
50 Package lid
52 Hole in package lid
100 Finished package/die assembly of the current invention
110,120,130,140 Finished package-die assemblies of the current invention
1100,1100,1200, 1300,1400 Assembled stack of externally-identical packages of the current invention, each having a first form factor
1450 Contact spreader/adaptor for mounting dissimilar package-stacks 1400 and 1500, having different external form factors, atop one another
1500 Assembled stack of externally-identical packages of the current invention, each having a second form factor

DESCRIPTION OF PREFERRED EMBODIMENTS—FIGS. 1-5

Reference will now be made in detail to the presently preferred embodiments of the invention as illustrated in the accompanying drawings. Those of ordinary skill in the art will realize the following description of the present invention is illustrative only and not in any way limiting. Other embodiments than those presented will readily suggest themselves to such skilled persons.

According to the invention, a stackable, configurable semiconductor package is provided, having a plurality of external electrical contact points disposed on the exterior surfaces of said package, a semiconductor chip disposed within said package, and a programmable means for selectively connecting ones of the external electrical contact points to the chip and to other ones of the external contact points. Preferably, the exterior surfaces of said package include a first major surface (referred to herein as the top surface) and a second major surface (referred to as the bottom surface) which are substantially parallel to one another; the external electrical contact points preferably comprise at least a first array of first terminals or top terminals disposed on the top surface and a second array of second terminals or bottom terminals disposed on the bottom surface. The package preferably includes an interconnect means whereby each first terminal can be mated with and connected to any second terminal. Thus, any first package whose first array substantially matches the second array of any second package may be mounted with the top surface of the first package opposing the bottom surface of the second package; the matching arrays are connected, so that the packages are stackable.

According to the invention, the package is preferably designed to facilitate a stacked arrangement with the top surface of any selected package opposing the bottom surface of any next successive package. The top and bottom terminals are arranged in arrays on the top and bottom surfaces of the package in such a way that an array on the top surface of one such package can be joined or "mated" together with the array on the bottom surface of another such package, forming "pancake stacks" of such interconnected packages:

The programmable means for selectively connecting ones of the external contact points to one another or to the enclosed chip preferably comprises a programmable interconnection matrix linking the external contact points and the enclosed chip. A means for programming the matrix is included to ensure that each package is configurable after manufacturing. The programmable matrix allows for customization of the package electrical connections.

Preferably, the programmable matrix is designed to permit connections including two primary types. A first connection type links the chip to one of the external contact points. Connections of this type can be further classified into two sub-categories: connections which link one of the top terminals of the package to the enclosed chip (referred to herein as root connections), and connections which link one of the bottom terminals of the package to the enclosed chip (referred to herein as branch connections). A second connection type links two or more of the external contact points, and is referred to herein as a trunk connection. When using the package stacks of the current invention to form circuits, one interconnects the enclosed chips using these connections and the interconnections between packages. As an example, consider a connection between a first chip in a first package and a second chip in a second package, where the second package is mounted directly atop the first package. One uses a branch connection to connect one of the bottom terminals of the second package to the second chip; this bottom terminal is connected to a corresponding top terminal of the first package. A root connection, linking this corresponding top terminal to the first chip, completes the connection. One uses trunk connections when there are other package intervening between the two connected packages; a trunk connection linking a top terminal to a bottom terminal allows a signal to pass through a package from top to bottom. With proper selection of trunk connections, a signal can pass through all intervening packages in a stack, connecting a chip in the lowest package, through a root connection, a plurality of trunk connections in series, and a branch connection, to a chip in the topmost package.

Each package preferably has more external contacts on both the top and bottom surfaces than are required to connect the enclosed chip; the extra external contacts are used to form trunk-only connections through the package. A "bus" signal which is connected to dice in several packages connected together in a stack may be formed by programming the uppermost and lowest packages with one branch connection and one root connection, respectively; all intervening packages have trunk connections, selected so that they connect together in series. Of these "in-between" packages, each package whose enclosed chip requires connection to this bus signal also has a branch connection linking the chip to either the top terminal or the bottom terminal linked by the trunk connection. The other in-between packages merely pass the signal through to the next level using their trunk-only connections. Clearly, the packages of the present invention can be used as building blocks to interconnect their enclosed chips.

Accordingly, there is also provided in accordance with the present invention, an assembly of electrically interconnectable semiconductor packages, comprising: a plurality of stackable, configurable semiconductor packages, each including a programmable means for making selected electrical connections from a die within the package to contact points disposed on the exterior package surfaces, and for connecting together selected contact points disposed on the exterior package surface. Each package includes: a package body with substantially parallel top and bottom exterior surfaces, having a cavity for placement of a die and a die mounted within said cavity, and having a plurality of internal electrical contact points and a means for connecting the die to at least one of the internal contact points. Each package further has a plurality of external contact points disposed on the top and bottom exterior surfaces of the package body. The external contact points comprise at least a first array of first terminals on the top surface and second array of second terminals on the bottom surface; each first terminal may be matably connected to any second terminal, so that the packages may be connected.

Packages of the present invention might be manufactured in a two-stage process whereby the package body is manufactured using a standard packaging technology, and the programmable matrix is manufactured separately using a different technology. The package body and matrix can be assembled together prior to or at the time of die/package assembly, and the matrix can be programmed separately (prior to any assembly), after package/matrix assembly, or even after the complete package/matrix/die assembly, with proper matrix design. However, the presently-preferred embodiment of the invention integrates the package body and programmable substrate, for reduced size and cost. Preferably, this package is manufactured using semiconductor processing techniques, so that the feature sizes are smaller than with standard packaging technologies, and the package can be as small as possible.

Preferably, said package body is a multi-layer package body having a plurality of alternating layers of at least one layer each of conductive traces and insulating material. A first layer of the alternating layers is a layer of first conductive traces wherein each first trace is operably connected to one of said internal contact points. A second layer of the alternating layers is a layer of second conductive traces within the package body, and a third layer of the alternating layers is a layer of insulating material separating the first layer from the second layer. A plurality of intersections is formed where the first conductive traces intersect with the second conductive traces. A plurality of trace-to-trace programmable interconnection elements link the first conductive traces to the second conductive traces, each located at or near the respective intersection between the first and the second conductive traces. A plurality of trace-to-contact programmable interconnection elements link the contact points disposed on the exterior package surface with the second traces. And a plurality of contact-to-contact programmable interconnection elements link selected pairs of external contacts together. Means are provided for selectively programming the interconnection elements.

Arrays of packages of the present invention may be formed hierarchically to form complex systems using the following procedure. First, the required IC chips are selected, and a schematic for the entire circuit is created, defining the desired electrical connections between the chips. Using this schematic, the stacking order of the packages is preferably optimized. If the chips are not already mounted within the packages, the rotational orientation of each chip within its package may also be desirably optimized. The desired connections are translated into programming instructions for each package. The packages are all programmed individually; mounting the chips within the package is desirably performed after programming. Preferably, each programmed package/die combination is electrically tested and burned-in (if required) at the package level. Then, the tested packages are stacked and aligned. Some pre-assembly stack-level testing is highly desirable at this point, and should be performed if there is any way of temporarily achieving electrical contact between the stacked packages. This pre-assembly stack-level test eliminates many potential stack failures by allowing defective packages to be swapped out before permanently connecting the packages together into a completed stack. Finally, the packages are aligned and stacked to form the assembly.

Thus, in accordance with the present invention there is also provided a method for preparing a high-speed, high-density integrated circuit assembly including a plurality of previously-selected integrated circuit chips interconnected according to a predetermined plurality of desired chip connections, comprising: providing a plurality of individually-programmable, electrically interconnectable, stackable integrated circuit packages, wherein each package includes at least one of said plurality of previously selected integrated circuit chips; translating said predetermined plurality of desired connections between the integrated circuit chips into a plurality of programming instructions for said plurality of packages; individually programming each package of said plurality of packages; and aligning and stacking said plurality of packages in an array. Preferably, programming each package comprises forming selected electrical connections between a chip within the package and a plurality of external electrical contact points, and forming electrical connections between pairs of said external electrical contact points. Desirably, each programmed package may be tested before stacking the packages in array form.

The simplest use of the present invention stacks identical packages with identical first and second arrays, wherein a first array is positioned directly above the second array; trunk connections are limited to connections linking a bottom terminal with the top terminal directly above it (on the top surface of the package). It is desirable to consider this simplified example in more detail, as it clarifies the use and advantages of the invention. With this simplified application of the invention, each external contact position defines a vertical "channel" through which any desired trunk connection can pass. More than one signal can utilize the same channel, with a break occurring between the two signals; for instance, one signal connecting the first, second and third packages in a stack can use the same channel as a signal which only runs between the fourth and fifth packages.

At this point, an example package and assembly of the invention will be discussed in detail. Hereinafter, the described packages and stacks of packages are in accordance with the simplified example outlined above, except where explicitly stated otherwise. The described package comprises an insulating substrate with a formed recess for receiving a thermally-conductive lid, and a deeper cavity in which the IC die is placed, both formed on the top surface of the substrate. When mounted, the IC die is attached within the die cavity with its top surface facing up. The die is then electrically connected to a surrounding ring of internal contact points using a plurality of bond wires. The internal contact points are connected to a programmable interconnection matrix, which is integral to the package. Preferably, the interconnection matrix is formed using at least two layers with conductive traces which are formed on the side of the package opposite the die cavity. The external contact points are also connected to the interconnection matrix; in the presently-preferred embodiment, these external contact points consist of a horseshoe-shaped array of solder bumps on the bottom surface of the package, a linear array of solder bumps formed along one edge of the package, a linear array of solder-contacts on the opposite edge of the package, and a horseshoe-shaped array of solder-contacts on the top surface of the package. Through a programming process, each of the internal contact points can be selectively connected to one or more external contact points. A flange on the lid is bonded to the lid recess in the top side of the package substrate, and the lid body is bonded to the surface of the IC die with a material which is thermally conductive, but electrically insulating. The lid conducts heat away from the IC die, and extends beyond the package body to act as a cooling "fin" for the package. In the presently-preferred embodiment of the present invention, the lid thickness is substantially equal to the thickness of the package body; thus, when a stack of packages is formed, the lid of each package is thermally connected to the lids of the packages above and below it in the stack. This arrangement provides a large thermal mass and a large thermal conductivity between lids, and tends to equalize the temperature of the stacked packages, and therefore of all IC dice incorporated into the package stack. If further cooling is required, a hole 52 bored through the lid beyond the package body may be used to bolt the stacked lids to a heat sink, or cooling fluids or gases may be introduced into the "pipe" formed by the holes in each successive lid. Alternatively, a heat sink or heat dissipation device might be connected to the stacked lids using a conductive epoxy.

Figure 1A:
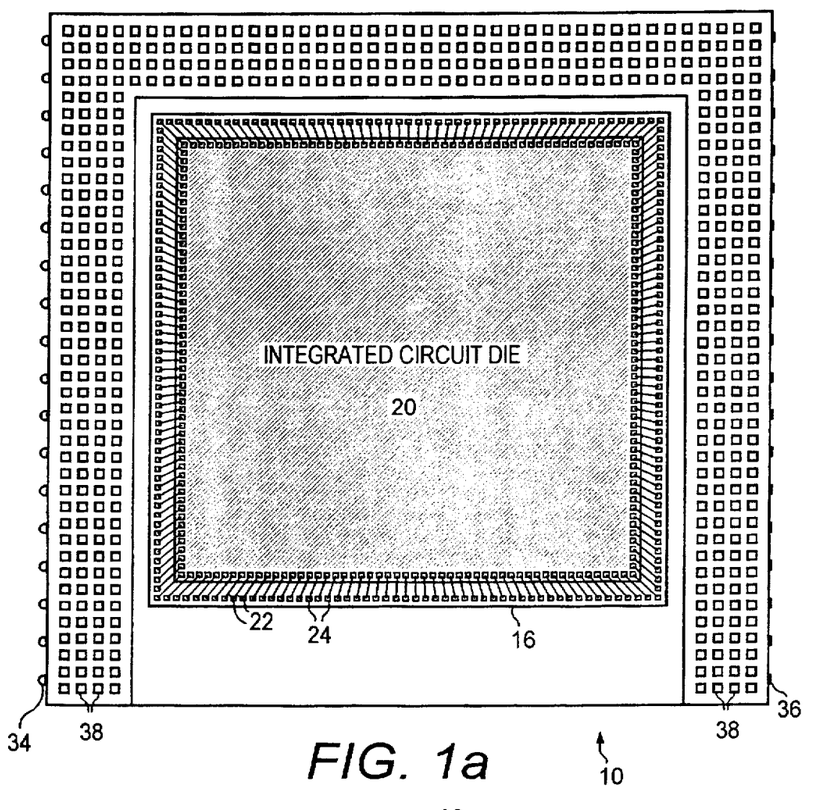
FIG. 1a is a plan view of the top surface of a package body/IC die sub-assembly, according to the invention.
Figure 1B:
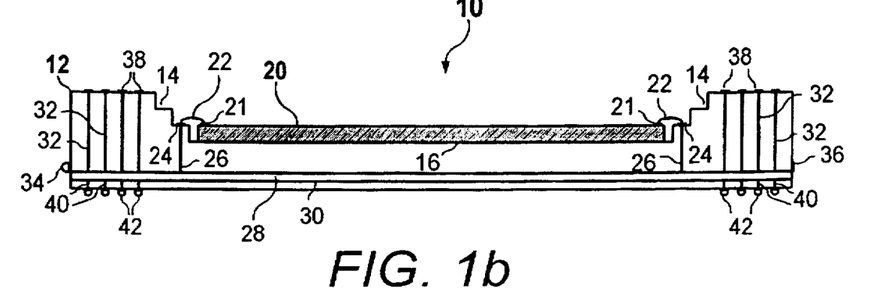
FIG. 1b is a cross-sectional view of a package body/IC-die subassembly, according to the invention.

With reference now to FIG. 1a, a package body is shown where an IC die has been mounted in the die cavity. When the package is fully assembled, a package lid is bonded to the top surface of this package assembly. In FIG. 1b is a cross-section of this same package subassembly through the center of the package. In FIGS. 1a and 1b, it is seen that a package subassembly 10 preferably comprises a package body 12 with a lid recess 14 and a die cavity 16, in which an integrated circuit chip 20 is mounted. The bond pads 21 of chip 20 are connected by bond-wires 22 to the package internal contact points (package bondpads) 24. The package bondpads 24 are connected through first vias 26 to traces on first conductor layer 28. Programmable connections between traces formed on first conductor layer 28 and traces formed on second conductor layer 30 are made selectively through programmable interconnection elements 29 formed in and between conductor layers 28 and 30. Traces on second conductor layer 30 may be programmably connected either: 1) through programmable interconnection elements 31 and vias 32 up to the top-surface primary package external contact points, solder-contacts 38; or 2) through programmable interconnection elements 33 and vias 40 down to the bottom-surface primary package external contact points, solder bumps 42. In addition, selected top-surface solder-contacts 38 can be programmably connected to their equivalent bottom-surface solder ball contact 42 if selected programmable elements 31 and 33 are programmed to the connected state. Using these three types of programmable connections, signals enter the package vertically in a given channel, through a top contact 38, a bottom contact 42, or passing through the package (top and bottom contacts 38 and 42 connected). Within the package, an internal contact point can be routed over to connect to this channel, either to a top external contact 38, a bottom external contact 42, or both.

Other traces on first conductor layer 28 are connected to side solder bumps 34 and/or to side solder-contacts 36. Using these traces and programmable interconnection elements linking these traces to the traces on second conductor layer 30, signals can also be connected from internal contact points to these auxiliary external contacts.

Package side solder-balls 34 and side solder-contacts 36 have two purposes. First, they provide test-points for accessing nets within the package in a debugging environment; a selected subset of internal contact points 24 may be connected to both a primary external contact point 38 or 42 and to one of the "auxiliary" external contact points 34 or 36. This gives the user an accessible place to access a signal for test purposes even after package 100 has been assembled into a stacked array, and primary package external contact points 38 are no longer accessible.

Figure 2A:
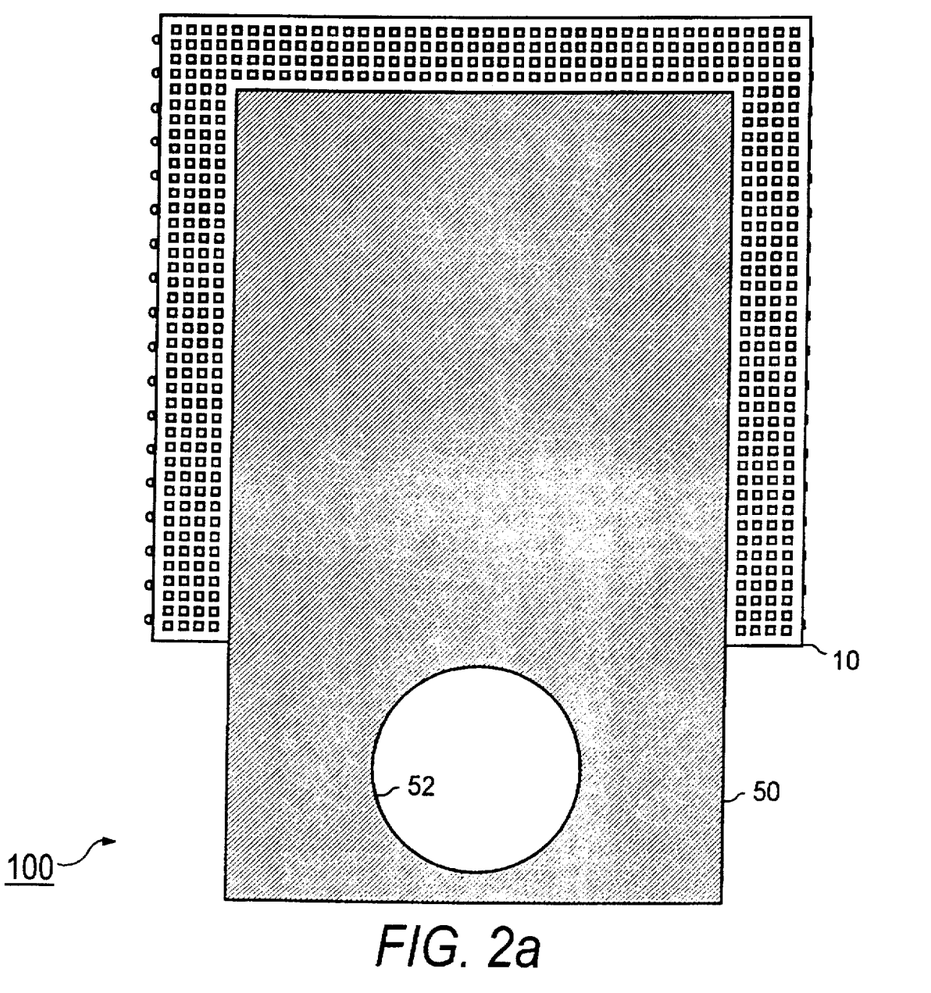
FIG. 2a is a plan view of the top surface of the completed package/die assembly, according invention.
Figure 2B:
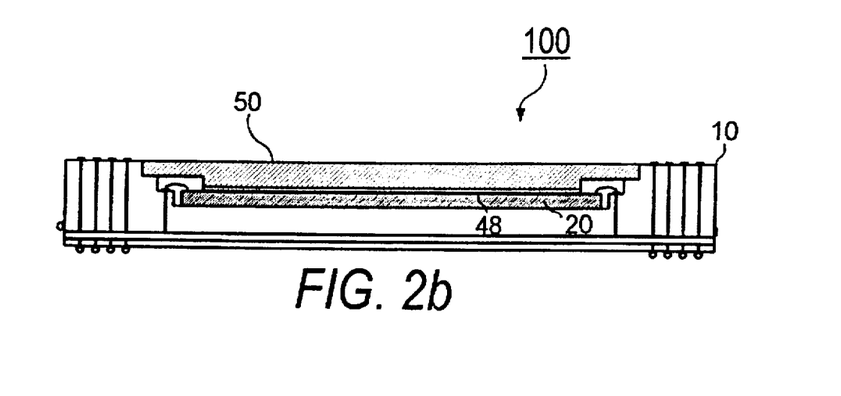
FIG. 2b is a cross-sectional view of the completed package/die assembly, according to the invention.

Referring now to FIGS. 2a and 2b, package sub-assembly 10 including integrated circuit die 20 is bonded using a layer 48 of thermally-conductive, electrically-insulating material (such as thermal epoxy) to package lid 50. Lid 50 is formed of a material having a high thermal conductivity such as copper. A hole 52 is provided in lid 50 for helping mount heat-dissipation devices to package assembly 100.

Stacks of the presented package may be formed using the general methodology outlined above; the pre-assembly stack-level test may be performed, using pressure to force good electrical contacts between packages in the stack. After stack-level testing, a heat cycle is used to bond the solder bumps of each package to the solder-contacts of the package below it in the stack. After the stack is completed, it can be re-tested and either re-worked or used as a completed unit.

Figure 3:
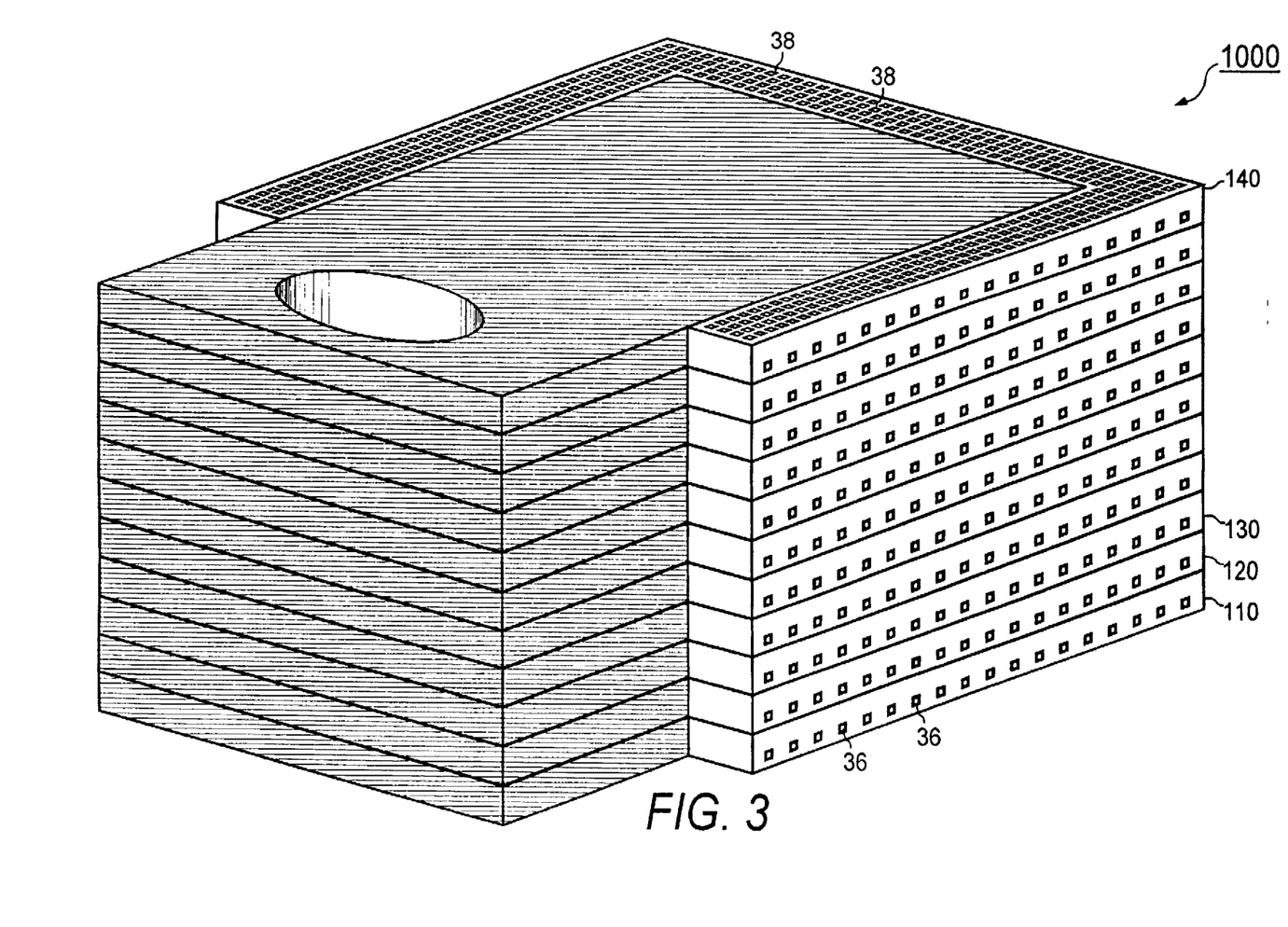
FIG. 3 is a diagram showing several packages mounted together in a stacked array, according invention.

Accordingly, package 100 is combined with other packages of the same form factor in a stacked arrangement; the bottom external contacts 38 of each package are electrically connected to the top external contacts of the package directly below it in the stack. Such an arrangement is shown in FIG. 3. In this figure, eleven packages are stacked together to form stacked assembly 1000. A first completed package assembly 110 forms the base of the stack. Directly above it, package 120 is mounted, with its bottom external contacts 42 mated with the top external contacts 38 of package 110. Above package 120, another package 130 is mounted, with its bottom external contacts 42 mated with the top external contacts of package 130. The IC chips enclosed by the packages are interconnected using root connections and branch connections, linked by these connections between top contacts 38 and 42; if there are intervening packages, linked trunk connections in selected channels complete the connections, as described above.

Different package stacks may be connected together to form even larger circuits. For example, package stacks can be linked together using the side solder-balls and solder-contacts. A solder hierarchy is used in the following manner to make this possible; the bottom-surface solder balls, which are used to form a stack, melt at the highest temperature; the side solder balls and adapter/spreader solder balls, which are used to connect stacks together or to connect stacks to a substrate, both melt at a lower temperature. Thus, once a stack is completed, it is never heated to a temperature high enough to disassemble the stack in a normal assembly procedure.

Figure 4:
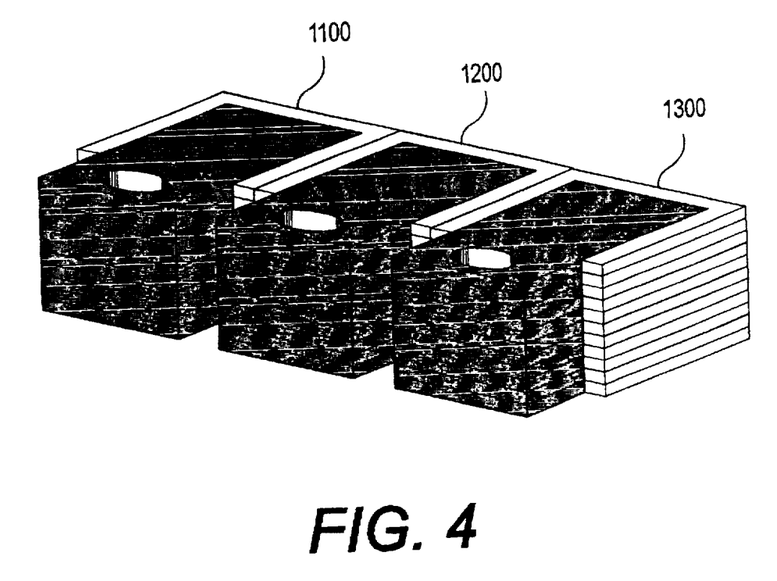
FIG. 4 is a diagram showing several package stacks, mounted together so that the auxiliary external contacts on the package sides are mated together, according to the invention.

FIG. 4 illustrates an assembly wherein several package stacks are linked side to side, using side solder-balls 34 and side solder-contacts 36. In this figure, stacked assembly 1200 is sandwiched between stacked assemblies 1100 and 1300; all three stacked assemblies are mounted on a conventional PC-board or other substrate (not shown) with the bottom contacts 42 of the lowest package in each stacked assembly connected to matching solder-contacts on the substrate. The auxiliary solder balls 34 of stacked assembly 1200 are connected to the auxiliary solder-contacts 36 of stacked assembly 1100; similarly, the auxiliary solder balls 34 of stacked assembly 1300 are connected to the auxiliary solder-contacts 36 of stacked assembly 1200. With this arrangement, connections between chips in different stacks can be made in one of two ways. First, connections can be made using one of the auxiliary connections between solder balls 34 and solder-contacts 36. Secondly, connections can be made by routing any signal to one of the bottom contacts 42 of the lowest package in a given stacked assembly, and connecting the signal through a trace on the substrate to any selected bottom contact 42 of the lowest package in the appropriate second stacked assembly.

Alternatively, stacked assemblies with different form factors can be connected together by using an adaptor/spreader which routes bottom external contacts compatible with one form factor to top external contacts which are compatible with the second form factor. Such an adaptor need not be programmable, and thus is relatively economical.

Figure 5:
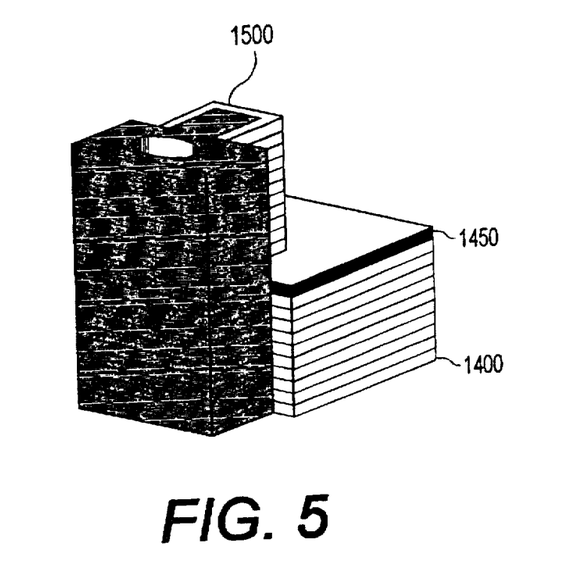
FIG. 5 is diagram showing how package stacks of different sizes might be connected together according to the invention.

FIG. 5 shows an example of such an arrangement. Stacked assembly 1400 has a first form factor large enough to enclose relatively-large IC dice and encompass a large number of external contacts. However, in this case it is desirable to connect stacked assembly 1400 to stacked assembly 1500, which has a second, smaller form factor. In this case, an adaptor 1450 is assembled between the two stacks as shown. Adaptor 1450 has a top array of contacts (not shown) which matches and mates with stacked assembly 1500, and a bottom array of contacts (not shown) which matches and mates with stacked assembly 1400; a known subset of the bottom contacts is connected to the top contacts.

From the descriptions above, a number of advantages of the present invention become evident:

(a) The programmable package and stacked assembly of the present invention provide a means for forming 3-d circuit stacks which are far more compact than competing 2-d circuit arrangements. The shorter connections between chips provide shorter time-of-flight and less parasitic capacitance and inductance, resulting in a significant speed advantage compared to the 2-d circuit arrangement.

(b) Programmable packages of the present invention can be manufactured using standard package technology if desired, merged with a conventional programmable matrix, making this circuit-stacking technique feasible and economical using current technology.

(c) The configurability of the package of the present invention provides a means for re-wiring each package, so that each chip need not be custom-designed for use in the stack.

(d) The assembly-stacking technique of the present invention provides a method of interconnecting non-identical integrated circuit chips in a stacked arrangement wherein only the packages need have matching configurations (and only with neighboring packages), so that the enclosed chips need not be similar in size and configuration.

(e) The configurable branch or root connections available in the package of the invention provide a quick and economical means of producing customized stackable semiconductor packages.

(g) The large number of top and bottom terminals and configurable trunk connections of the assembly of the invention provide a method for interconnecting semiconductor chips in a stacked environment rich in connections and efficient in its use of input and output connections.

(h) The method of the invention provides a technique for producing custom, high-speed, vertically-linked multi-chip-modules which can still be tested at the package level and thus bypass many of the traditional multi-chip module limitations.

When each package of the present invention is to be configured, it is loaded into a programmer. According to a presently-preferred embodiment, the package of the invention is programmable utilizing an application of a plurality of selected electrical signals to the package internal electrical contact points and external electrical contact points; in this case, the programmer preferably is similar to the familiar EPROM or FPGA programmers common today in the electronics industry, and a simple electrical programming process defines the package connectivity. Such programmers currently sell for a relatively-small price, in the hundreds or thousands of dollars. Programmers designed specifically to program the programmable packages of the present invention would preferably sell for a similar low price.

Such a programmer might be placed in the chip manufacturer's factory, if the chip manufacturer packages their own dice. Thus, the chip manufacturer could offer their products with a variety of pin-outs, and could quickly produce an order of parts with a custom pin-out on demand. Similarly, such a programmer could advantageously be located in a package assembly company. Then, the chip manufacturer could send wafers to be packaged in the programmable packages with prescribed pin-outs. If a customer (system manufacturer) desired to keep the pin-out of their custom packages secret, the customer could then order dice from the chip manufacturer, and have them assembled to specification at the package assembly house. For even more secrecy and convenience, such a programmer could be located in the systems manufacturer's factory. With this arrangement, the systems manufacturer could make the package programming a part of their production line, and various versions of the systems products might be produced using variations in the package programming. This could be accomplished in two ways. First, the systems manufacturer might order bare dice from the chip manufacturer, and program the packages prior to assembly of the die in the package. Alternatively, with the correct programmable architecture, pre-packaged dice could be purchase unconfigured, and configured in-house by programming the package with the die already present in the package.

CONCLUSIONS, RAMIFICATIONS, AND SCOPE OF INVENTION

Accordingly, it is seen that the programmable package and package stack of the present invention provides a means of quickly and economically producing compact circuit arrangements, and is especially suited for connecting together today's large, I/O-intensive integrated circuits. Clearly, the stacked arrangement gives each design a high degree of modularity; and the programmability of the interconnections ensures a high degree of flexibility. The compact assemblies of stacked packages described herein are useful in building tightly-coupled functional blocks which are even larger than those possible with a single high-density integrated circuit chip, yet are capable of high-speed operation. In particular, the shorter connections between chips allowed by the invention provide shorter time-of-flight and less parasitic capacitance and inductance, resulting in a significant speed advantage compared to the 2-d circuit arrangement.

With inherently smaller dimensions and reduced parasitics, significant speed advantages and reduced power consumption are produced using any stacked package interconnection scheme. The programmable packages of the current invention, however, deliver these advantages without the high tooling costs and long lead times required to produce custom interconnections using prior-art packaging technologies. Yet the programmable packages of the present invention can be manufactured using standard package technology if desired, merged with a conventional programmable matrix, making this circuit-stacking technique feasible and economical using current technology.

The configurability of the package of the present invention provides a means for re-wiring each package, so that each chip need not be custom-designed for use in the stack. In fact, only the packages need have matching configurations (and only with neighboring packages), so that the enclosed chips need not even be similar in size and configuration. The configurable branch or root connections available in the package of the invention provide a quick and economical means of producing customized stackable semiconductor packages. The large number of top and bottom terminals and configurable trunk connections of the assembly of the invention provide a method for interconnecting semiconductor chips in a stacked environment rich in connections and efficient in its use of input and output connections.

The method of the invention provides a technique for producing custom, high-speed, vertically-linked multi-chip-modules which can still be tested at the package level and thus bypass many of the traditional multi-chip module limitations. With the ability to program each package using a small, low-cost programmer which can be located in-house, systems designers can now produce custom-designed systems in a very short time. Conceivably, using packages with a non-permanent connection scheme (such as stackable pin-grid-array packages), packages with die already inside might be programmably connected in a new design, taking only the time necessary to program each package and stack them together. Clearly, this methodology can produce custom-designed systems even faster than a custom PC-board methodology. This method can be extended to include an iterative development technique where stacked assemblies are quickly assembled, tested, modified to improve their characteristics, then re-assembled and tested again, etc. Such a methodology can provide substantial time-to-market advantages in producing high-speed complex systems.

The package described as a preferred embodiment of the present invention uses an included electrically-programmable interconnection matrix to provide quick and easy programmability of the packages. Low-cost programmers for the described packages can be located in a chip-manufacturer's factory, in a system manufacturer's factory, or even in a chip distribution warehouse. The described package allows for programmable interconnection of top and bottom external contacts in each channel, which provides efficient use of these vertical interconnection channels. Multiple separate electronic signals can share the same vertical channel. With this scheme, a stack of packages can have many more separate electrical signals than it has channels, providing a package rich in the interconnections needed by today's increasingly-complex integrated circuits.

The stackable, programmable packages of the current invention provide a practical means of producing customized, high-speed, vertically-linked multi-chip modules in which the die can still be tested at the package level. This package testability bypasses many of the traditional multi-chip module limitations related to low module yield.

Although the descriptions above contains many specificities, these should not be construed as limiting the scope of the invention but as merely a means of illustrating some of the presently preferred embodiments of this invention. For example, those of ordinary skill in the art will see that the probrammable, stackable package concept of the present invention is useful in many forms, many of which are not explicitly described herein. For example, stackable packages using pins, leads or any external contact arrangement suitable for stacking would benefit from the described use of programmability. Also, trunk connections that link top and bottom terminals in different channels may sometimes be useful; even connections between two top terminals or two bottom terminals are sometimes of value.

Thus, the scope of the invention should be determined by the appended claims and their legal equivalents, rather than by the examples given.

I claim:

1. A stackable, configurable substantially rectangular semiconductor package, said package having a plurality of exterior surfaces including a top surface and a bottom surface, comprising:

a plurality of external electrical contact points disposed on the exterior surfaces of said package, said plurality of external electrical contact points comprising at least a first array of first terminals disposed on said top surface of said package and a second array of second terminals disposed on said bottom surface, said package having a cavity for receiving a semiconductor chip, or die, mounted within said package; and a third array of third terminals about the cavity to which the semiconductor chip is connected to the package;

a first electrically nonconducting layer in which are located a plurality of parallel first conducting traces substantially parallel with a first package side, one of each trace electrically connected between one of said third terminals and one of said first array of first terminals;

a second electrically nonconducting layer in which are located a plurality of parallel second conducting traces substantially orthogonal to said first conducting traces and parallel to a second package side, one of each trace electrically connected to one of said second array of second terminals;

a third electrically nonconducting layer between the first and the second electrically nonconducting layers;

a configurable interconnect means for selectively connecting ones of said plurality of external electrical contact points to said semiconductor chip and to other ones of said plurality of external electrical contact points comprising a plurality of first programmable interconnection elements electrically linking said first conductive traces to said second conductive traces, wherein each interconnection element is located near one of said intersections, whereby said first conductive traces may be selectively connected to said second conductive traces, a plurality of second programmable interconnection elements electrically linking said second conductive traces to said second array of second terminals or to said first array of first terminals, or both;

a plurality of intersections formed where ones of said first conductive traces overlay ones of said second conductive traces;

a plurality of interconnection elements electrically connecting at selective intersections one of said first conductive traces to one of said second conductive traces; and wherein each said trace is electrically sectionable therein enabling desired electrical circuits within the collective traces.

2. The package of claim 1 further comprising:

a plurality of said semiconductor packages, said packages stacked vertically in a linear array with said top surface of any selected package opposing said bottom surface of any next successive package, wherein said first array of first terminals disposed on said top surface of said selected package and said second array of second terminals disposed on said bottom surface of said next successive package have a substantially-matching configuration;

alignment means for aligning said plurality of semiconductor packages, such that said first array of first terminals of said selected package is aligned with and opposing said second array of second terminals of said next successive package; and said interconnect means electrically connecting each first terminal to any second terminal, such that said first array of first terminals of said selected package may be electrically connected to said second array of second terminals of said next successive package.

3. The plurality of packages of claim 2 wherein each said package exterior surfaces comprise parallel first and second sides separated by a third side defining said perimeter and said cavity within and disposed to surround said semiconductor chip on three sides leaving an open fourth side opposite said third side.

4. The plurality of packages of claim 3 wherein said lid has an aperture therethrough and further comprising a lid over said die cavity and disposed in thermal contact with said die mounted within said die cavity, said lid being formed of a material having a high thermal conductivity and including a first portion extending beyond a perimeter of said package body as a cooling fin, and wherein said lid exits said perimeter through said open fourth side, and means for thermally connecting the lid first portions.

5. The plurality of packages of claim 4 wherein each lid first portion has an aperture therethrough in mutual alignment collective forming a pipe through which the lids may be cooled such as by passing cooling gases therethrough or by connection to a heat sink.

6. The assembly of claim 1, wherein said package body comprises a plurality of said conductive layers alternating between a said first layer and a said second layer with a said third layer separating each said first layer from each said second layer with said configurable interconnect means selectively between each said first and second layers.

7. The assembly of claim 1 wherein each package further comprises a lid over said die cavity and disposed in thermal contact with said semiconductor die mounted within said die cavity, said lid being formed of a material having a high thermal conductivity and including a first portion extending beyond a perimeter of said package body as a cooling fin.

8. The package of claim 1 further comprising:

A plurality of semiconductor packages, said packages arranged side-by-side wherein said plurality of exterior surfaces of each said package body includes first and second opposing side surfaces substantially parallel to each other, and wherein said second plurality of electrical contact points further comprises at least a third array of third terminals disposed on said first side surface and a fourth array of matching fourth terminals disposed on said second side such third terminals of a given package first side surface are in electrical connection with fourth terminals of a different package second side surface when said first side of said given package is arranged side-by-side with said second side of said different package surface; and said interconnect means electrically connecting each third terminal to any fourth terminal, selectively.

* * * * *